United States Patent
Pan et al.

(10) Patent No.: US 12,009,236 B2
(45) Date of Patent: Jun. 11, 2024

(54) SENSORS AND SYSTEM FOR IN-SITU EDGE RING EROSION MONITOR

(71) Applicant: Applied Materials, Inc., Santa Clara, CA (US)

(72) Inventors: Yaoling Pan, San Jose, CA (US); Patrick John Tae, Sunnyvale, CA (US); Michael D. Willwerth, Campbell, CA (US); Leonard M. Tedeschi, San Jose, CA (US); Daniel Sang Byun, Campbell, CA (US); Philip Allan Kraus, San Jose, CA (US); Phillip A. Criminale, Livermore, CA (US); Changhun Lee, San Jose, CA (US); Rajinder Dhindsa, Pleasanton, CA (US); Andreas Schmid, Meyriez (CH); Denis M. Koosau, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/391,262

(22) Filed: Apr. 22, 2019

(65) Prior Publication Data
US 2020/0335368 A1 Oct. 22, 2020

(51) Int. Cl.
*H01L 21/67* (2006.01)
*H01J 37/32* (2006.01)
(Continued)

(52) U.S. Cl.
CPC .. *H01L 21/67259* (2013.01); *H01J 37/32477* (2013.01); *H01J 37/3288* (2013.01);
(Continued)

(58) Field of Classification Search
None
See application file for complete search history.

(56) References Cited

U.S. PATENT DOCUMENTS 5,267,607 A 12/1993 Wada
5,660,673 A 8/1997 Miyoshi
(Continued)

FOREIGN PATENT DOCUMENTS

CN 105336561 A 2/2016
CN 105789010 A 7/2016
(Continued)

OTHER PUBLICATIONS

"Bracelet Holder Vise Clamp Stone Prong Pave Channel Setting Setter." Prolinemax, www.prolinemax.com/BRACELET-HOLDER-VISE-Clamp-Stone-Prong-Pave-Channel-Setting-Setter-_p_1006.html.
(Continued)

*Primary Examiner* — Keath T Chen
*Assistant Examiner* — Margaret Klunk
(74) *Attorney, Agent, or Firm* — Patterson + Sheridan, LLP

(57) ABSTRACT

The present disclosure generally relates to a method and apparatus for determining a metric related to erosion of a ring assembly used in an etching within a plasma processing chamber. In one example, the apparatus is configured to obtain a metric indicative of erosion on an edge ring disposed on a substrate support assembly in a plasma processing chamber. A sensor obtains the metric for the edge ring. The metric correlates to the quantity of erosion in the edge ring. In another example, the ring sensor may be arranged outside of a periphery of a substrate support assembly. The metric may be acquired by the ring sensor through a plasma screen.

7 Claims, 8 Drawing Sheets

(51) Int. Cl.
*H01L 21/66* (2006.01)
*H03K 17/955* (2006.01)

(52) U.S. Cl.
CPC .......... *H01L 22/12* (2013.01); *H03K 17/955* (2013.01); *H01J 2237/022* (2013.01)

(56) References Cited

U.S. PATENT DOCUMENTS

| | | |
|---|---|---|
| 5,730,801 A | 3/1998 | Tepman et al. |
| 5,762,714 A | 6/1998 | Mohn et al. |
| 5,851,140 A | 12/1998 | Barns et al. |
| 5,885,428 A | 3/1999 | Kogan |
| 6,022,809 A | 2/2000 | Fan |
| 6,044,534 A | 4/2000 | Seo et al. |
| 6,206,976 B1 | 3/2001 | Crevasse et al. |
| 6,375,748 B1 | 4/2002 | Yudovsky et al. |
| 6,391,787 B1 | 5/2002 | Dhindsa et al. |
| 6,511,543 B1 | 1/2003 | Stauss et al. |
| 6,589,352 B1 | 7/2003 | Yudovsky et al. |
| 6,676,759 B1 | 1/2004 | Takagi |
| 6,709,547 B1 | 3/2004 | Ni et al. |
| 6,744,212 B2 | 6/2004 | Fischer et al. |
| 6,773,562 B1 | 8/2004 | Inagawa et al. |
| 6,896,765 B2 | 5/2005 | Steger |
| 6,898,558 B2 | 5/2005 | Klekotka |
| 7,138,014 B2 | 11/2006 | Stevens et al. |
| 7,138,067 B2 | 11/2006 | Vahedi et al. |
| 7,176,403 B2 | 2/2007 | Steger |
| 7,252,738 B2 | 8/2007 | Tong et al. |
| 7,311,784 B2 | 12/2007 | Fink |
| 7,338,578 B2 | 3/2008 | Huang et al. |
| 7,589,950 B2 | 9/2009 | Parkhe et al. |
| 7,824,146 B2 | 11/2010 | Lanee et al. |
| 7,968,469 B2 | 6/2011 | Collins et al. |
| 8,270,141 B2 | 9/2012 | Willwerth et al. |
| 8,298,371 B2 | 10/2012 | Koshimizu et al. |
| 8,441,640 B2 | 5/2013 | Patalay et al. |
| 8,696,878 B2 | 4/2014 | Riker et al. |
| 8,900,398 B2 | 12/2014 | Dhindsa et al. |
| 8,933,628 B2 | 1/2015 | Banna et al. |
| 8,988,848 B2 | 3/2015 | Todorow et al. |
| 8,999,106 B2 | 4/2015 | Liu et al. |
| 9,011,637 B2 | 4/2015 | Yamamoto |
| 9,017,526 B2 | 4/2015 | Singh et al. |
| 9,076,636 B2 | 7/2015 | Ohata et al. |
| 9,142,391 B2 | 9/2015 | Yamamoto |
| 9,287,093 B2 | 3/2016 | Singh et al. |
| 9,410,249 B2 | 8/2016 | Male et al. |
| 9,583,357 B1 | 2/2017 | Long et al. |
| 9,601,319 B1 | 3/2017 | Bravo et al. |
| 9,620,376 B2 | 4/2017 | Kamp et al. |
| 9,761,459 B2 | 9/2017 | Long et al. |
| 9,852,889 B1 | 12/2017 | Kellogg et al. |
| 9,881,820 B2 | 1/2018 | Wong et al. |
| 9,947,517 B1 | 4/2018 | Luere et al. |
| 10,103,010 B2 | 10/2018 | Luere et al. |
| 10,504,702 B2 | 12/2019 | Luere et al. |
| 10,553,404 B2 | 2/2020 | Luere et al. |
| 10,600,623 B2 | 3/2020 | Sarode Vishwanath |
| 10,790,123 B2 | 9/2020 | Sarode Vishwanath |
| 10,991,556 B2 | 4/2021 | Luere et al. |
| 11,284,018 B1 | 3/2022 | Ummethala et al. |
| 11,589,474 B2 | 2/2023 | Criminale et al. |
| 2003/0173031 A1 | 9/2003 | Aggarwal et al. |
| 2003/0201069 A1 | 10/2003 | Johnson |
| 2004/0053428 A1 | 3/2004 | Steger |
| 2004/0149389 A1 | 8/2004 | Fink |
| 2004/0261946 A1 | 12/2004 | Endoh et al. |
| 2005/0061447 A1 | 3/2005 | Kim et al. |
| 2005/0133164 A1 | 6/2005 | Fischer et al. |
| 2005/0263070 A1 | 12/2005 | Fink |
| 2007/0131253 A1 | 6/2007 | Nakamura et al. |
| 2008/0066868 A1 | 3/2008 | Masuda |
| 2008/0173237 A1 | 7/2008 | Collins et al. |
| 2008/0236749 A1 | 10/2008 | Koshimizu et al. |
| 2008/0289766 A1 | 11/2008 | Heemstra et al. |
| 2009/0041568 A1 | 2/2009 | Muraoka et al. |
| 2009/0067954 A1 | 3/2009 | Lanee et al. |
| 2010/0101729 A1 | 4/2010 | Kim et al. |
| 2010/0196625 A1* | 8/2010 | Yoon ................. H01J 37/32422 427/569 |
| 2010/0206484 A1 | 8/2010 | Hiromi et al. |
| 2011/0011534 A1 | 1/2011 | Dhindsa |
| 2011/0031111 A1 | 2/2011 | Kobayashi |
| 2011/0157760 A1 | 6/2011 | Willwerth et al. |
| 2011/0180983 A1* | 7/2011 | Arun ................. H01J 37/32495 269/86 |
| 2011/0287631 A1 | 11/2011 | Yamamoto |
| 2012/0052599 A1 | 3/2012 | Brouk et al. |
| 2012/0091108 A1 | 4/2012 | Lin et al. |
| 2012/0176692 A1 | 7/2012 | Yamawaku et al. |
| 2012/0256363 A1 | 10/2012 | Okita et al. |
| 2012/0305184 A1 | 12/2012 | Singh et al. |
| 2013/0093443 A1* | 4/2013 | Patrick .................... C23C 16/50 324/700 |
| 2013/0106286 A1 | 5/2013 | Banna et al. |
| 2013/0155568 A1 | 6/2013 | Todorow et al. |
| 2014/0017900 A1 | 1/2014 | Doba et al. |
| 2014/0213055 A1 | 7/2014 | Himori et al. |
| 2014/0265089 A1 | 9/2014 | Tantiwong et al. |
| 2015/0064809 A1 | 3/2015 | Lubomirsky |
| 2015/0181684 A1 | 6/2015 | Banna et al. |
| 2015/0200124 A1 | 7/2015 | Yamamoto |
| 2015/0332951 A1 | 11/2015 | Male et al. |
| 2016/0042926 A1 | 2/2016 | Ishikawa et al. |
| 2016/0056017 A1 | 2/2016 | Kim et al. |
| 2016/0211165 A1 | 7/2016 | McChesney et al. |
| 2016/0211166 A1* | 7/2016 | Yan .................... H01L 21/67069 |
| 2016/0240415 A1 | 8/2016 | Sekiya |
| 2017/0018411 A1 | 1/2017 | Sriraman et al. |
| 2017/0069462 A1 | 3/2017 | Kanarik et al. |
| 2017/0103870 A1 | 4/2017 | Marakhtanov et al. |
| 2017/0110335 A1 | 4/2017 | Yang et al. |
| 2017/0113355 A1 | 4/2017 | Genetti et al. |
| 2017/0115657 A1 | 4/2017 | Trussell et al. |
| 2017/0117170 A1 | 4/2017 | Wong et al. |
| 2017/0117172 A1 | 4/2017 | Genetti et al. |
| 2017/0133283 A1* | 5/2017 | Kenworthy ....... H01J 37/32807 |
| 2017/0178917 A1 | 6/2017 | Kamp et al. |
| 2017/0213753 A1 | 7/2017 | Rogers |
| 2017/0213758 A1* | 7/2017 | Rice ................. H01J 37/32082 |
| 2017/0236688 A1 | 8/2017 | Caron et al. |
| 2017/0236741 A1 | 8/2017 | Angelov et al. |
| 2017/0236743 A1 | 8/2017 | Severson et al. |
| 2017/0250056 A1 | 8/2017 | Boswell et al. |
| 2017/0263478 A1 | 9/2017 | McChesney et al. |
| 2017/0278679 A1 | 9/2017 | Angelov et al. |
| 2017/0287682 A1 | 10/2017 | Musselman et al. |
| 2017/0287753 A1 | 10/2017 | Musselman et al. |
| 2017/0316935 A1 | 11/2017 | Tan et al. |
| 2017/0330786 A1 | 11/2017 | Genetti et al. |
| 2017/0334074 A1 | 11/2017 | Genetti et al. |
| 2017/0372912 A1 | 12/2017 | Long et al. |
| 2018/0019107 A1 | 1/2018 | Ishizawa |
| 2018/0052104 A1 | 2/2018 | Larsson et al. |
| 2018/0061618 A1 | 3/2018 | Nichols et al. |
| 2018/0061696 A1 | 3/2018 | D'Ambra et al. |
| 2018/0090354 A1 | 3/2018 | Sugita et al. |
| 2018/0151334 A1* | 5/2018 | Lin .................. H01L 21/67069 |
| 2018/0166259 A1 | 6/2018 | Ueda |
| 2018/0204757 A1 | 7/2018 | Fushimi |
| 2018/0218933 A1 | 8/2018 | Luere et al. |
| 2018/0233328 A1 | 8/2018 | Ueda et al. |
| 2018/0277416 A1 | 9/2018 | Takahashi et al. |
| 2018/0301322 A1 | 10/2018 | Sugita et al. |
| 2018/0308737 A1 | 10/2018 | Moriya et al. |
| 2018/0315583 A1 | 11/2018 | Luere et al. |
| 2018/0315640 A1* | 11/2018 | Ueda ................. H01J 37/32715 |
| 2019/0013232 A1 | 1/2019 | Yan et al. |
| 2019/0088531 A1 | 3/2019 | Sarode Vishwanath et al. |
| 2019/0172688 A1 | 6/2019 | Ueda |
| 2019/0172714 A1 | 6/2019 | Bobek et al. |
| 2019/0187003 A1* | 6/2019 | Brunnett ................. G01K 1/10 |
| 2019/0318918 A1 | 10/2019 | Saitoh et al. |

(56) References Cited

U.S. PATENT DOCUMENTS

| | | | |
|---|---|---|---|
| 2019/0333785 A1* | 10/2019 | Tanikawa | H01J 37/32091 |
| 2020/0020510 A1 | 1/2020 | Shoeb et al. | |
| 2020/0234981 A1 | 7/2020 | Schmid et al. | |
| 2020/0273678 A1* | 8/2020 | Funk | H01J 37/32642 |
| 2020/0393242 A1 | 12/2020 | Vishwanath et al. | |
| 2020/0395195 A1* | 12/2020 | Sanchez | H01J 37/32642 |
| 2021/0378100 A1 | 12/2021 | Criminale et al. | |
| 2022/0272278 A1 | 8/2022 | Ummethala et al. | |

FOREIGN PATENT DOCUMENTS

| | | |
|---|---|---|
| JP | 2000049144 A | 2/2000 |
| JP | 3020898 B2 | 3/2000 |
| JP | 2001230239 A | 8/2001 |
| JP | 2002176030 A | 6/2002 |
| JP | 2006186171 A | 7/2006 |
| JP | 2008078208 A | 4/2008 |
| JP | 2011054933 A | 3/2011 |
| JP | 2013511847 A | 4/2013 |
| JP | 2015050156 A | 3/2015 |
| KR | 20060117537 A | 11/2006 |
| TW | 439093 B | 6/2001 |
| TW | 201243942 A | 11/2012 |
| TW | 201324674 A | 6/2013 |
| TW | 201526101 A | 7/2015 |
| TW | M587362 U | 12/2019 |
| WO | 2008005756 A2 | 1/2008 |
| WO | 2013035983 A1 | 3/2013 |

OTHER PUBLICATIONS

Chinese Office Action dated May 16, 2019 for Application No. 201822159176.8.

Notice of Allowance and Fees Due dated Oct. 6, 2017 for U.S. Appl. No. 15/382,004.

Notice of Allowance and Fees Due dated Oct. 25, 2017 for U.S. Appl. No. 15/382,004.

Notice of Allowance and Fees Due dated Feb. 21, 2018 for U.S. Appl. No. 15/382,004.

Notice of Allowance and Fees Due dated Jun. 27, 2018 for U.S. Appl. No. 15/951,540.

Non-Final Office Action dated Feb. 4, 2019 for U.S. Appl. No. 16/026,853.

Notice of Allowance and Fees Due dated Aug. 19, 2019 for U.S. Appl. No. 16/026,853.

Notice of Allowance and Fees Due/ Examiner Initiated Interview Summary dated Sep. 23, 2019 for U.S. Appl. No. 16/026,853.

Taiwan Office Action dated Sep. 20, 2019 for Application No. 106100104.

PCT Notification of Transmittal of the International Search Report and the Written Opinion of the International Searching Authority for International Application No. PCT/US2019/051771; dated Mar. 24, 2020; 11 total pages.

Japanese Office Action for Application No. JP 2019-111014 dated Aug. 25, 2020.

International Search Report and Written Opinion for PCT/US2020/016242 dated Jul. 14, 2020.

U.S. Appl. No. 18/109,660, filed Feb. 14, 2023, entitled "Diagnostic Disc With a High Vacuum and Temperature Tolerant Power Source".

Japanese Office Action for Application No. 2021-547724 dated Nov. 14, 2023.

Chinese Office Action for Application No. 202080021717.8 dated Aug. 22, 2023.

Taiwan Office Action for Application No. 109105803 dated Aug. 4, 2023.

* cited by examiner

SENSORS AND SYSTEM FOR IN-SITU EDGE RING EROSION MONITOR

BACKGROUND

Field of Endeavor

Examples described herein generally relate to a substrate processing method and apparatus, and more specifically to an improved apparatus for detecting erosion in an edge ring.

Description of the Related Art

In semiconductor processing chambers, a substrate can undergo a variety of plasma processing operations such as deposition, etching, and annealing in plasma processing chambers such as a physical vapor deposition (PVD), chemical vapor deposition (CVD), plasma enhanced CVD (PECVD) or other chambers. A substrate is placed onto a top surface of a substrate support, such as an electrostatic chuck (ESC) for holding the substrate for plasma processing, such as an etch operation. A ring assembly may be disposed along an outer periphery of the top surface of the substrate support circumscribing the substrate. During an etch process, the ring assembly prevents erosion of the substrate support and additionally shapes the plasma along the outer periphery of the substrate support in order to form a uniform plasma profile from the center to the edge of the substrate.

The ring assembly can be made of quartz, silicon, SiC, or other suitable material. During etch processing, the ring assembly may erode due to exposure to etching gases, plasma, or both. The erosion of the ring assembly may lead to process drift due to material removed from the ring affecting the profile of the processing plasma along the edge of the substrate. Such a process drift will inevitably lead to defects on the substrate. The ring assembly is replaced during preventative maintenance prior to significant erosion affecting processing results to ensure process conformity and to prevent manufacturing defects from affecting processing yields. However, replacing the ring assembly requires significant time and expense as the processing equipment must be stopped during maintenance operations.

Ring erosion has been a long term issue for both productivity and technology development. Since the erosion rate of edge ring is very much dependent on the plasma chemistries and process conditions, it is very difficult to precisely determine the service life of ring which can result in production inefficiencies. Prior approaches to determining edge ring erosion have been largely heuristic, where an operator schedules edge ring replacement after a certain period of time. Based upon the severity of erosion observed by the operator, the period of time may be shortened or extended. Manufacturers must weigh the tradeoffs and benefits of shutting down the manufacturing equipment to replace the ring assembly prior to the erosion of the edge ring results in defects, thus lowering manufacturing yields.

As such, there is a need in the art to reduce manufacturing downtime while maintaining good processing results.

SUMMARY

A plasma processing chamber is configured to monitor a method of an edge ring. A chamber has a chamber body that includes a plurality of walls defining an internal volume. A substrate support assembly is disposed within the internal volume. The substrate support assembly has an outer periphery. The substrate support assembly includes a substrate support extending to the outer periphery. The substrate support assembly has a top surface. An edge ring having an upper surface is disposed on the top surface proximate the outer periphery. At least a first sensor is disposed within the chamber body below the top surface and outside the outer periphery of the substrate support assembly. The ring sensor is configured to detect a metric of the edge ring.

In another example disclosed herein, a plasma processing chamber is provided that includes a chamber body having a plurality of walls defining an internal volume. A substrate support assembly is disposed within the internal volume. The substrate support assembly has an outer periphery. The substrate support assembly also has a substrate support extending to the outer periphery, and a top surface. An edge ring has an upper surface and is disposed on the top surface proximate the outer periphery. A sensor is disposed within the chamber body below the top surface of the substrate support assembly. The ring sensor is configured to detect a metric of the edge ring. The metric corresponds to at least a displacement, impedance, and/or propagation of an acoustic wave through the edge ring.

In yet another example, a method of processing a substrate is provided. The method includes disposing an edge ring on the top surface proximate the outer periphery, the ring has an upper surface. The method also includes disposing a sensor within the chamber body below the top surface. A metric of the edge ring is acquired utilizing the ring sensor. The metric corresponds to a displacement, impedance, or an acoustic wave of the edge ring. The method further includes adjusting a height of the edge ring based upon the metric. The method also includes processing the substrate by exposure to plasma within the chamber body.

BRIEF DESCRIPTION OF THE DRAWING

So that the manner in which the above recited features of the present disclosure can be understood in detail, a more particular description of the disclosure, briefly summarized above, may be had by reference to examples herein, some of which are illustrated in the appended drawings. It is to be noted, however, that the appended drawings illustrate only examples and are therefore not to be considered limiting of its scope, and may admit to other equally effective examples.

To facilitate understanding, identical reference numerals have been used, where possible, to designate identical elements that are common to the figures. It is contemplated that elements and features of one example may be beneficially incorporated in other examples without further recitation.

DETAILED DESCRIPTION

Examples disclosed herein generally relate to a plasma processing chamber is configured to monitor a method of an edge ring. Advantageously, monitoring the edge ring erosion enables process recipe adjustments to reduce the erosion. Precisely monitoring the service life of the edge ring not only helps improve productivity, but also reduces operation costs by reducing the replacement frequency of the ring assembly. In-situ monitoring of the edge ring also allows for the real-time control of edge ring position to enhance possible plasma uniformity during processing operations.

Examples herein are illustratively described below in reference to use in a system that is configured to etch substrates. However, it should be understood that the disclosed subject matter has utility in other system configurations such as chemical vapor deposition systems, physical vapor deposition systems, and other systems in which a ring assembly on a substrate support is exposed to plasma within a process chamber. It should also be understood that examples disclosed herein may be adapted for practice in other process chambers that are configured to process substrates of various sized and dimensions.

Advantageously, examples of the disclosure herein enable in-situ measurement of the erosion of a ring assembly. By more precisely determining erosion, a more consistent plasma profile can be maintained in the processing chamber. The maintenance of a consistent plasma profile affects the quality of the substrates produced. Accordingly, application of the apparatus and method disclosed herein allow for increase yields in substrate processing. In addition, preventive maintenance can be scheduled based upon the actual level of ring assembly erosion, as opposed to prior approaches which simply relied on operators adhering to a fixed time schedule. Moreover, by scheduling preventative maintenance based upon the actual erosion of the ring, the cost of ownership is decreased as the mean time between service intervals is extended. Furthermore, costs are reduced because the operator is able to avoid situations where production is ceased during routine time-based scheduled maintenance, only to discover that sufficient erosion has not occurred to warrant ring assembly replacement.

While the sensor is described above as disposed below the top surface of the substrate support assembly, it should be appreciated that the sensor disclosed herein may be also be positioned at the top surface. It should therefore be noted hereforth that each description of the sensor described as below the top surface may also be disposed at the top surface, and each description of the sensor disposed at the top surface may also be positioned below the top surface.

Figure 1A:
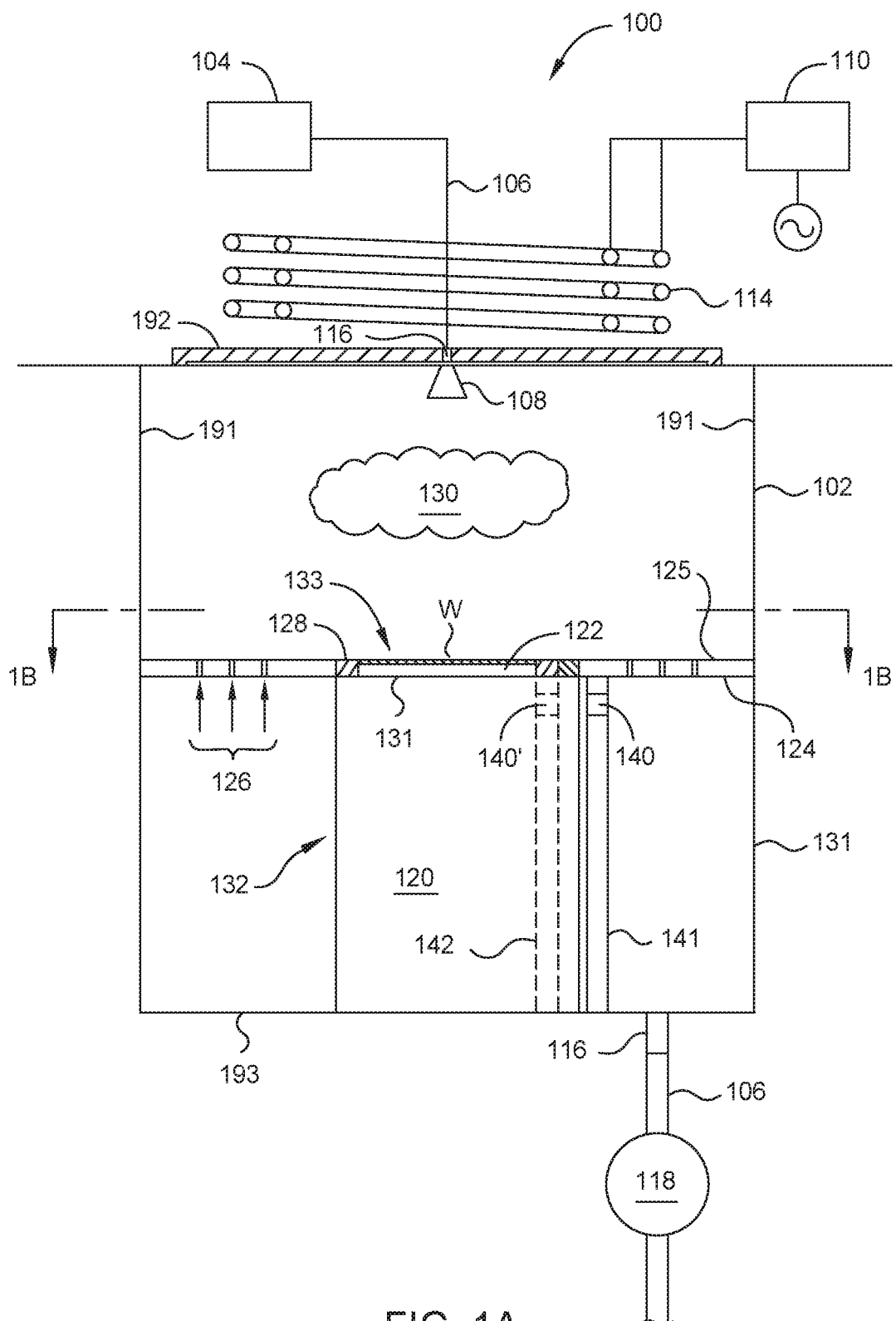
FIG. 1A is a schematic side plan view of an exemplary processing chamber having a ring sensor for monitoring erosion of an edge ring of a substrate support assembly.

FIG. 1A is a cross sectional view of a plasma processing chamber 100 having a ring assembly 128. The plasma processing chamber 100 may be a plasma etch chamber, a plasma enhanced chemical vapor deposition chamber, a physical vapor deposition chamber, a plasma treatment chamber, an ion implantation chamber or other suitable vacuum processing chamber. As shown, the plasma processing chamber 100 is an etch chamber suitable for etching a substrate W. The substrate W may be a semiconductor wafer, glass panel, or other workpiece.

The plasma processing chamber 100 may be used for various plasma processes. In one example, the plasma processing chamber 100 may be used to perform etching with one or more etching agents. For example, the processing chamber may be used for maintaining a plasma from a gas such as $C_xF_y$ (where x and y can be different allowed combinations), $O_2$, $NF_3$, $SF_6$, $CH_xF_y$, or combinations thereof, or $Cl_2$, $HBr$, $BCl_3$, $SiCl_4$, etc. The plasma processing chamber 100 includes a chamber body 102, which includes a plurality of sidewalls 191, a chamber lid 192 and a chamber bottom 193. The plurality of sidewalls 191, the chamber lid 192, and the chamber bottom 193 enclose and define an internal volume 103.

A gas nozzle 108 is coupled to an aperture 116 formed through the lid 192. The aperture 116 is coupled to a conduit 106. A gas panel 104 is coupled by the conduit 106 to the aperture 116 and is configured to provide gas to the internal volume of the chamber body 102 through the nozzles 108.

The chamber body 102 includes a second aperture 116 formed through the chamber bottom 193. The second aperture 116 is fluidly coupled to a pump 118 that is configured to remove gases from the internal volume 103 of the chamber body 102, and maintain a vacuum with the internal volume 103.

A plurality of coils 114 is disposed above the chamber body 102. The coils 114 are coupled to a power supply 112, such as an RF power supply. Gases present in the internal volume 103 are energized by power inductively coupled to the gas through the coils 114 to form a plasma.

A substrate support assembly 120 is disposed in the internal volume 103 of the chamber body 102. The substrate support assembly 120 has a top surface 131 and an outer periphery 132. A substrate support 122 is part of the substrate support assembly 120. The substrate support 122 may be an electrostatic chuck. The substrate support 122 has a substrate mounting surface 133 that is configured to accept the substrate W thereon during processing. The ring assembly 128 and the substrate support 122 form in part the top surface 131 of the substrate support assembly 120.

The ring assembly 128 is disposed on the substrate support 122. An upper face 201 (shown in FIG. 2) of the substrate support 122 is coplanar to the top surface 131 of the substrate support assembly 120. The ring assembly 128 is positioned on the top surface 131 proximate the outer periphery 132 of the substrate support assembly 120.

One or more ring sensors 140 are disposed adjacent to the ring assembly 128. In one example, the ring sensor 140 is shown below the top surface 131 of the substrate support assembly 120. In another example, the ring sensor 140 is shown below at a top surface of the plasma screen 124. The ring sensor 140 is supported by a conductive rod 141. The conductive rod 141 may be made of any suitable conductive metal, including aluminum. The conductive rod 141 is positioned laterally outside of the outer periphery 132 of the substrate support assembly 120, such that the ring sensor 140 is also positioned laterally outside of the outer periphery 132. In another example, the one or more ring sensors 140 is positioned within a conductive sleeve 142. In this example, the conductive sleeve 142 is laterally positioned inside of the outer periphery 132 of the substrate support assembly 120. In this example, the one or more ring sensors 140 is also laterally positioned inside of the outer periphery 132.

A plasma screen 124 is positioned outside and adjacent to the outer periphery 132 of the substrate support assembly 120. The plasma screen 124 has an upper surface 125 positioned parallel to the top surface 131 of the substrate support assembly 120. In one example, the upper surface 125 of the plasma screen 124 is coplanar with the top surface 131 at the ring assembly 128. In another example, the upper surface 125 of the plasma screen 124 is coplanar with the substrate mounting surface 133 of the substrate support 122. The plasma screen 124 has a plurality of openings 126 that are configured to permit gas to pass through the openings 126 while substantially preventing plasma from passing therethrough. For example, the openings 126 may be angular or have other shape preventing vertical line of sight from an area above the upper surface 125 of the plasma screen 124 through the openings 126 to an area below the plasma screen 124.

Figure 1B:
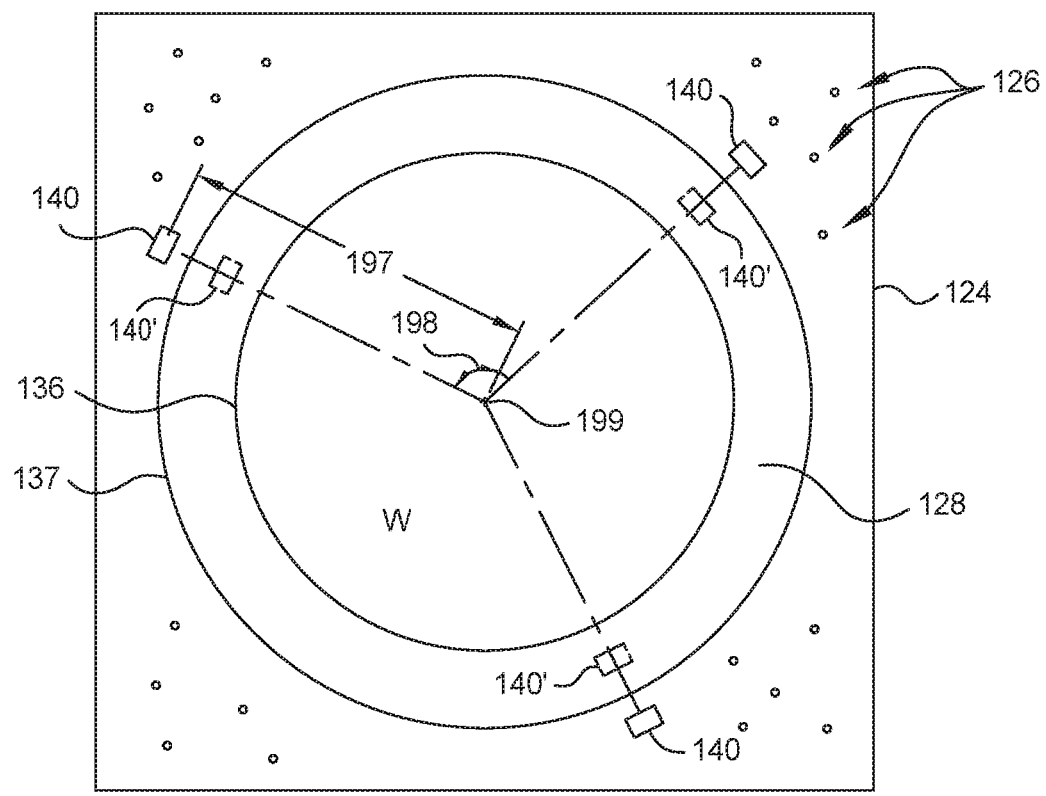
FIG. 1B is a schematic, cross sectional plan view of the processing chamber taken along line BB in FIG. 1A.

Turning briefly to FIG. 1B, FIG. 1B is a schematic, cross sectional plan view of the processing chamber taken along line BB in FIG. 1A. In one example, each ring sensor 140 is positioned at a distance 197 from a center axis 199 of the substrate support assembly 120. Each ring sensor 140 is positioned at an angle 198 from the center axis 199 to an adjacent ring sensor 140 disposed below the edge ring 228. In one example, three ring sensors 140 are equally spaced apart by an angle of 120 degrees. In another example, four ring sensors 140 are equally spaced apart by an angle of 90 degrees. However, it should be understood that equal spacing of the ring sensors 140 are not necessary and in some examples the ring sensors are equally effective when irregularly spaced, such as to accommodate the structure of the substrate support assembly 120.

Figure 2A:
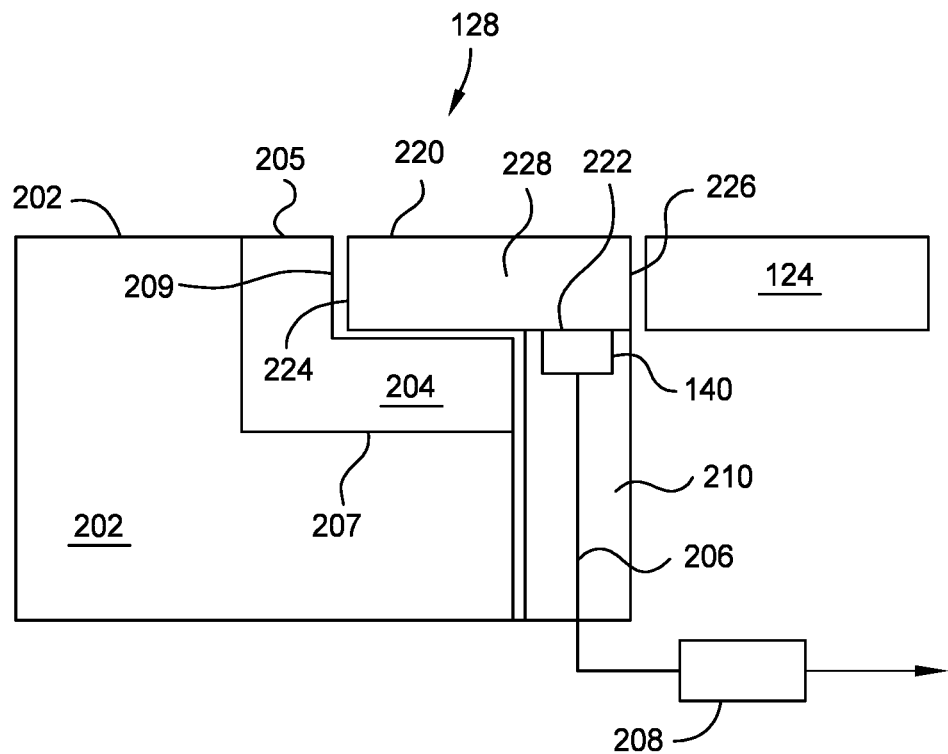
FIG. 2A is a plan view of a portion of the substrate support assembly of FIG. 1A illustrating one example of the ring sensor disposed within the substrate support assembly.

Turning now to FIG. 2A, FIG. 2A is a plan view of a portion of the substrate support assembly 120 of FIG. 1A illustrating one example of the ring sensor 140 disposed within the substrate support assembly 120. The substrate support assembly 120 includes an electrostatic chuck (ESC) 202, i.e., substrate support 122, the ring assembly 128 and a conductive sleeve 210. The ring assembly 128 may be a single ring or a multiple part assembly. In one example, the ring assembly 128 has an inner ring 204 and an edge ring 228.

The inner ring 204 is supported, at least in part, by the electrostatic chuck 202. The inner ring 204 has an edge top surface 205, edge bottom surface 207, and an edge vertical surface 209. The edge vertical surface 209 is parallel to an inner surface 224 of the edge ring 228. An outer surface 226 of the edge ring 228 is disposed adjacent to the plasma screen 124.

The edge ring 228 is supported in part by the inner ring 204 and the conductive sleeve 210 in the substrate support assembly 120. The edge ring 228 includes an upper surface 220, a lower surface 222, the inner surface 224, and an outer surface 226. The upper surface 220 is substantially parallel to the lower surface 222. The inner surface 224 is substantially parallel to the outer surface 226, and substantially perpendicular to the lower surface 222. A cross-sectional profile of the edge ring 228 is substantially rectangular, but may alternatively have other configurations.

The ring sensor 140 is disposed within the conductive sleeve 210 that is positioned proximate to the lower surface 222 of the edge ring 228. A gap (or spacing) may exist between the lower surface 222 of the edge ring 228 and the conductive sleeve 210. The ring sensor 140 is disposed below the top surface 131 of the substrate support assembly 120. Each sensor 140 is further disposed adjacent to the edge ring 228. The ring sensor 140 may be a proximity sensor (e.g., a capacitive sensor), a displacement sensor, impedance sensor, or an acoustic sensor. Wiring 206 couples outputs of the ring sensor 140 to a communication circuit 208 that transmits data acquired by the ring sensor 140 to a controller 618 depicted in FIG. 6. The data may be digital or analog. The data acquired by the ring sensor 140 is indicative of a metric of the edge ring 228. The metric further corresponds to an erosion of the edge ring 228. The ring sensor 140 may also receive instructions from the CPU 620 via the communication circuit 208.

Figure 2B:
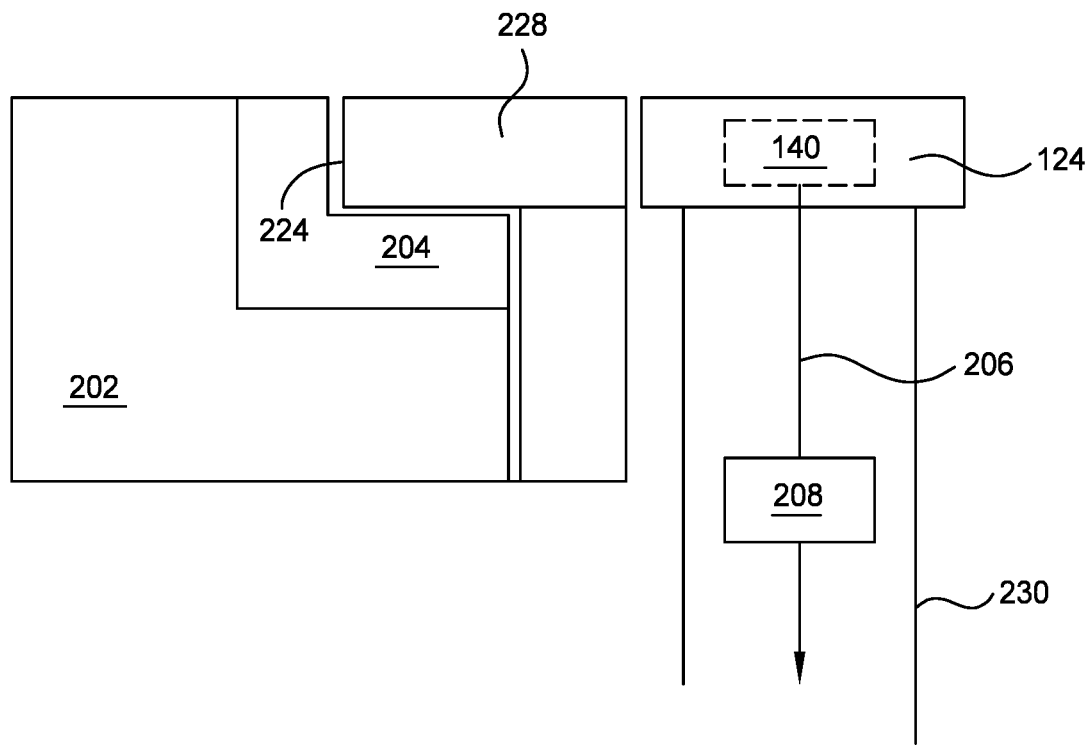
FIG. 2B is a plan view of a portion of the substrate support assembly of FIG. 1A illustrating another example of the ring sensor disposed outside of a periphery of the substrate support assembly.
Figure 6:
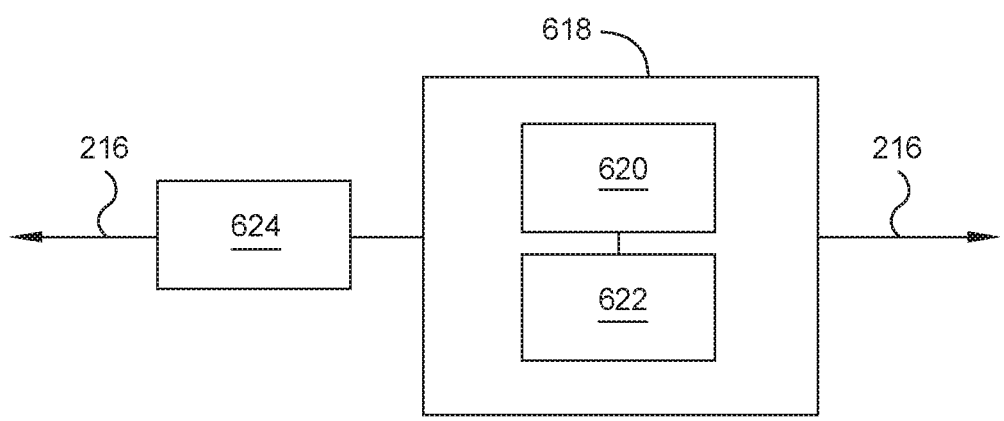
FIG. 6 is a schematic view of a computer system suitable for implementing various examples of the plasma processing chamber and method and apparatus for determining a metric related to erosion of a ring assembly.

FIG. 2B illustrates another example of a partial cross sectional view of a portion of the plasma processing chamber 100. The ring sensor 140 is disposed outside of the outer periphery 132 of the substrate support assembly 120. The ring sensor 140 may be disposed within a conductive rod 230. The conductive rod 230 abuts a lower surface of the plasma screen 124. The plasma screen 124 is electrically coupled to the ring assembly 128. In some examples, the plasma screen 124 has additional outer rings that abut the edge ring 228, the electrostatic chuck 202, or both. The ring sensor 140 may be embedded within the plasma screen 124. The ring sensor 140 may also be coplanar with a surface of the plasma screen 124. In a manner substantially similar to the example in FIG. 2A, wiring 206 couples the ring sensor 140 to a communication circuit 208 that transmits data acquired by the ring sensor 140 to a controller 618, (as shown in FIG. 6 and discussed below). The ring sensor 140 may also receive instructions from the CPU 620 via the communication circuit 208.

SENSOR EXAMPLES

As discussed above, the ring sensors 140 may be any one of the displacement sensors, impedance sensors, or acoustic sensors, and proximity sensors, which are further detailed below. In each of the examples below, the communication circuit 208 transmits data between the ring sensor 140 and a controller 618 for processing. From this data, erosion characteristics of the edge ring 228 can be determined. The metric of the edge ring 228 that is acquired by the ring sensor 140 may be utilized to control the position of the edge ring 228 in a manner that promotes plasma uniformity. The metric may also may be utilized to maintain a constant plasma profile within the chamber body 102 used to predict or indicate when the edge ring 228 needs servicing or replacement. As such, employing the method and apparatus disclosed herein, the timing for preventive replacement of the edge ring 228 may be accurately determined or predicted.

Displacement Sensors

Figure 3A:
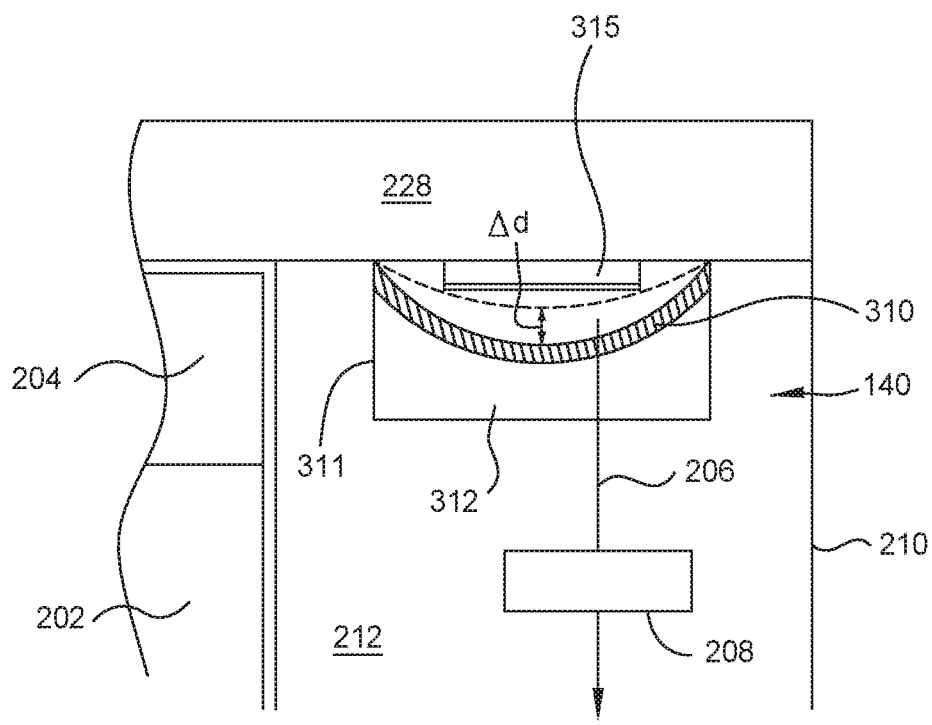
FIG. 3A is a plan view of a portion of the substrate support assembly of FIG. 1A having one example of a ring sensor.

FIG. 3A is a plan view of a portion of the substrate support assembly of FIG. 1A having one example of the ring sensor. A displacement sensor can indirectly measure the erosion of the edge ring 228. The ring sensor 140 includes a flexible membrane 310. Erosion of the edge ring 228 may be determined by measuring the displacement of the flexible membrane 310. In one example, the ring sensor 140 is at least partially disposed in an opening 312 of the conductive sleeve 210. The opening 312 includes one or more sidewalls 311. The flexible membrane 310 is positioned within opening 312 and attached to the sidewalls 311. In some examples, an attachment member 315 is attached to the edge ring 228 and positioned above the opening 312. The attachment member 315 contacts and displaces the flexible membrane 310 with the weight of the edge ring 228 fully supported thereon the attachment member 315.

Figures 5, 5A:
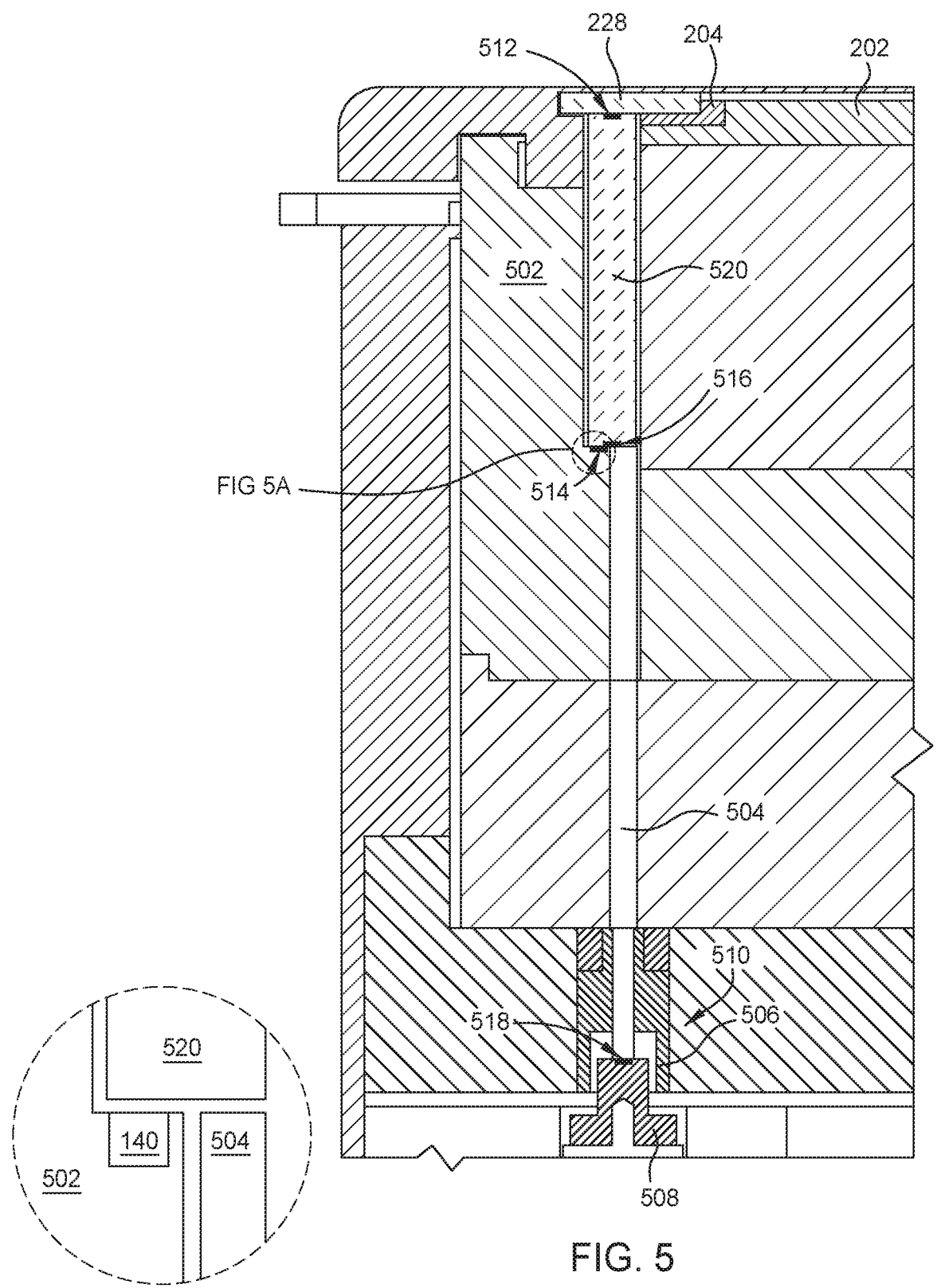
FIG. 5 illustrates various positions for a ring sensor in a substrate support assembly of FIG. 1A.
FIG. 5A is a cross-sectional view of a portion of the quartz pipe illustrated in FIG. 5.

Referring additionally to FIG. 5, FIG. 5 illustrates various positions for the ring sensor 140 in the substrate support assembly 120. In one example, the attachment member 315 is also arranged at a first position 512 beneath the edge ring 228. As illustrated in FIG. 3A, the attachment member 315 is coupled to the edge ring 228 and the flexible membrane 310. The flexible membrane 310 is configured to deflect a distance Δd. The distance Δd that the flexible membrane 310 deflects corresponds to the weight of the edge ring 228. The weight of the edge ring 228 decreases as erosion of the ring material increases. In the some of the following examples, the ring sensor 140 is mounted within a conductive sleeve 520.

In another example of the present disclosure, the ring sensor 140 is alternatively mounted at a second position 514 below the conductive sleeve 520. The ring sensor 140 sidewalls 311 and opening 312 are configured in a similar manner to the description above. In this example, the attachment member 315 is also coupled to the flexible membrane 310

FIG. 5A is a cross-sectional view of a portion of the quartz pipe 502. As illustrated in FIG. 5A, the ring sensor 140 may be positioned in a heel 522 of a quartz pipe 502. Positioning of the sensor 140 in the heel 522 of the quartz pipe 502 enables access to wiring 206 or the communication circuit 208. In this example, the ring sensor 140 is substantially stationary with respect to edge ring 228. The ring sensor 140 is configured to measure the force caused by the weight of the conductive sleeve 210 and the weight of the edge ring 228. In this measurement configuration, the edge ring 228 does not abut the inner ring 204. The measured force may be influenced by frictional forces received by the conductive sleeve 210. The conductive sleeve 210 may experience frictional forces as the edge ring 228 is mounted on the substrate support 122. As a conductive sleeve 520 is adjusted by the movement of a pushing pin 504, it may abut the quartz pipe 502 causing friction. The conductive sleeve 520 may also abut other components, such as the substrate support 122, creating friction in a similar manner. The friction can be filtered out by the controller 618 or the communication circuit 208.

In another example, the ring sensor 140 is alternatively mounted at a third position 516 at the bottom of the conductive sleeve 520. The ring sensor 140 can also be mounted within the pushing pin 504 at the third position 516. In this example, the attachment member 315 is also coupled to the conductive sleeve 520 and the flexible membrane 310. The ring sensor 140 is mounted inside of the conductive sleeve 520.

In yet another example, the ring sensor 140 is alternatively mounted at a fourth position 518 below the pushing pin 504. The rings sensor 140 may also be positioned above a base member 508. As such, the ring sensor 140 may be positioned inside the base member 508. The ring sensor 140 can also be mounted within the pushing pin 504 at this fourth position 518. The pushing pin 504 is mounted in the base member 508. The ring sensor 140 abuts a bottom 506 of the pushing pin 504. The ring sensor 140 is configured to detect the weight of the edge ring 228. The ring sensor is also configured to detect the weight of the conductive sleeve 520. The ring sensor 140 is also configured to detect the weight of the pushing pin 504. In a manner similar to the examples above, pushing pin 504 may receive frictional forces as the edge ring 228 is mounted on the substrate support 122. The pushing pin 504 may also receive frictional forces as the pushing pin 504 abuts a bearing 510. In this example, the bearing 510 constrains relative motion of the pushing pin 504 to a desired direction. The bearing 510 may be positioned within the base member 508.

The ring assembly 128 may be coupled to the conductive sleeve 520 through the pushing pin 504. The pushing pin 504 may extend through a surface of the chamber bottom 193 of the chamber body 102. The conductive sleeve 520 is suitable for moving the ring assembly 128 up and down within the chamber body 102 between plural lower positions and a number of raised positions. The conductive sleeve 520 may be coupled to an actuator 624 illustrated in FIG. 6, such as a motor or may be a threaded screw, or other suitable devices for positioning the ring assembly 128 with respect to the substrate support 122.

The conductive sleeve 520 allows the edge ring 228 to be moved vertically within the chamber body 102 between a lower transfer portion and a number of raised process positions. In some examples disclosed herein, the edge ring 228 interfaces with the conductive sleeve 520. In some examples, the conductive sleeve 520 may be driven by the actuator 624. In other example, the conductive sleeve 142 may be disposed within the conductive sleeve 520.

Thus, disclosed herein are several techniques for indirectly detecting erosion of the edge ring 228 by determining the deflection of the flexible membrane 310 in one example of the ring sensor 140. It should be appreciated that each of the following sensors may be arranged without limitation as the ring sensor 140, as depicted in FIGS. 2A and 2B.

Capacitive Ring Sensors

The ring sensor 140 may utilize a capacitive ring sensor to detect the deflection of the flexible membrane 310. The ring sensor 140 may be coupled to a piezo-resistive strain gauge that utilizes the piezo-resistive effect to detect strain due to applied pressure. Within a piezo-resistive material, a measureable resistance increasing as pressure deforms the material of a thin diaphragm (not shown) coupled to the ring sensor 140.

Applied pressure causes the thin diaphragm (i.e. a plate of a capacitor) to deflect a length Δl and the capacitance to change. The applied pressure is caused by the force resulting from the weight of the edge ring 128. A change in weight of the edge ring 128 is proportional to the deflection of the thin diaphragm. Accordingly, a change in capacitance may be used to control the frequency of an oscillator or to vary the coupling of an AC signal through a network. The capacitance may also be directly measured by using electronic circuits, such as switched capacitor circuits. The capacitive ring sensor uses the diaphragm and a pressure cavity to create a variable capacitor to detect strain due to applied pressure. The applied pressure (i.e. force) from edge ring causes the thin diaphragm to deform by a measurable length Δl. Capacitance decreases as pressure deforms the diaphragm. Capacitance (C) is proportional to the dielectric constant of the material between the plates. The Capacitance (C) can be expressed by the following equation: $C=\mu A/d$, $\mu$=dielectric constant of the material between the plates, A=area of the plates, d=spacing between the plates. By monitoring capacitance change of the ring sensor 140, one is able to detect the erosion of edge ring 128.

Strain Gauge Ring Sensors

As discussed above, sensor 140 may also utilize a strain gauge to detect the deflection of the flexible membrane 310. The strain gauge may be physically affixed to flexible membrane 310. A strain gauge takes advantage of the physical property of electrical conductance and its dependence on the geometry of the flexible membrane 310. When the flexible membrane 310 is stretched, the strain gauge will become narrower and longer, which increases its electrical resistance. Conversely, when a conductive material is compressed, it will broaden and shorten, which decreases its electrical resistance. From the measured electrical resistance of the strain gauge, the amount of induced stress may be determined, which is proportional to the weight of the edge ring 128.

For example, the strain gauge may be a strip of metallic material having an electrical resistance (R), that can be expressed by R=ρ L/WT, where ρ=resistivity, L=length, W=width, and T=thickness. Metallic strain gauges depend on dimensional changes to produce a change in resistance. A stress applied to the strip causes it to become slightly longer, narrower, and thinner, resulting in a resistance of: R=ρ(L+ΔL)/(W−ΔW)(T−ΔT). The output voltage is proportional to the change in resistance caused by strain of the strip of metallic material.

Optical Interferometric Sensors

The ring sensor 140 may be coupled to an optical interferometer. The optical interferometer is also configured to detect the deflection of the flexible membrane 310. The optical interferometer has at least one light-emitting element. The light-emitting element may emit light or some other form of electromagnetic wave. In most interferometers light from a single source is split into two beams that travel different optical paths, then the light beams recombine to produce interference.

A beam of light emitted from the light-emitting element changes direction at a refractive surface as the beam enters a surface of the flexible membrane 310. Each of the light beams travels a different path, and is subsequently recombined before arriving at a detector. The path difference, i.e., the difference in the distance traveled by each beam, creates a phase difference between the light beams. The phase difference creates the interference pattern between initially identical light waves. If a single electromagnetic beam has been split along two paths, then the phase difference corresponds to a physical change in the path length itself, or a change in the refractive index along the path. The refractive index (n) is defined as n=c/v where c is the speed of light in vacuum and v is the phase velocity of light in the medium.

The deformation of the thin diaphragm that varies according to changes in pressure or force. A change in pressure or force caused by the weight of edge ring 128 can cause changes in the interference pattern. Detecting the changes in interference patterns enables the monitoring of edge ring 128 erosion.

Applicant discloses herein several techniques for directly detecting the erosion of the edge ring 228 utilizing another example of the ring sensor 140.

Proximity Sensors

A proximity sensor is another example of the ring sensor 140. In this example an electrode pair, including first electrode 350 and second electrode 360 illustrated in FIGS. 3C and 3D, may be embedded in the edge ring 228. The ring sensor 140 may be embedded beneath the upper surface 220 of the edge ring 228. The ring sensor 140 may be embedded above the lower surface 222 of the edge ring 228. In other examples, there may be additional electrode pairs. The two electrodes 350 and 360 may be modelled as a resistor and capacitor, in parallel. Capacitance across the electrodes 350 and 360 is measured. When the edge ring 228 is made of a highly resistive semiconductor or insulating material, the edge ring 228 provides high resistance, so capacitance between the first electrode 350 and second electrode 360 can be measured. For example, the change in capacitance corresponds to a change in thickness of the edge ring 228. When the edge ring 228 is made of a conductive material such as metallic material, the edge ring 228 provides high capacitance, so resistance between the first electrode 350 and second electrode 360 can be measured. In this example, the change is resistance corresponds to the change in thickness of the edge ring 228. The change in thickness may be determined by subtracting a measured thickness (via the ring capacitance information) from an original thickness of the edge ring 228 to determine the overall erosion in the edge ring 228. Alternatively, the capacitance measured may correspond to an absolute thickness of the edge ring 228. The capacitance may be compared to a threshold that corresponds to a predetermined threshold minimum thickness of the edge ring 228. The change in thickness or the rate that the measured thickness is approaching the threshold minimum thickness may also be used to determine an erosion rate of the edge ring 228. Whether determining a thickness change in edge ring 228, absolute value of the thickness, or erosion rate the thickness information may be utilized to predict or indicate when the edge ring 228 needs servicing or replacement.

The proximity sensor can be configured to emit an electromagnetic field or electromagnetic radiation, such as infrared radiation. Changes in the electromagnetic field are detected by the sensor 140. The proximity sensor is configured to detect the edge ring 128. The type of proximity sensor corresponds to the material of the edge ring 128. For example, a capacitive proximity sensor or photoelectric sensor might be suitable for detecting semiconductor material or polymers. In another example, an inductive proximity sensor may be suitable for detecting metallic material.

Piezoelectric Acoustic Sensors

Figure 3B:
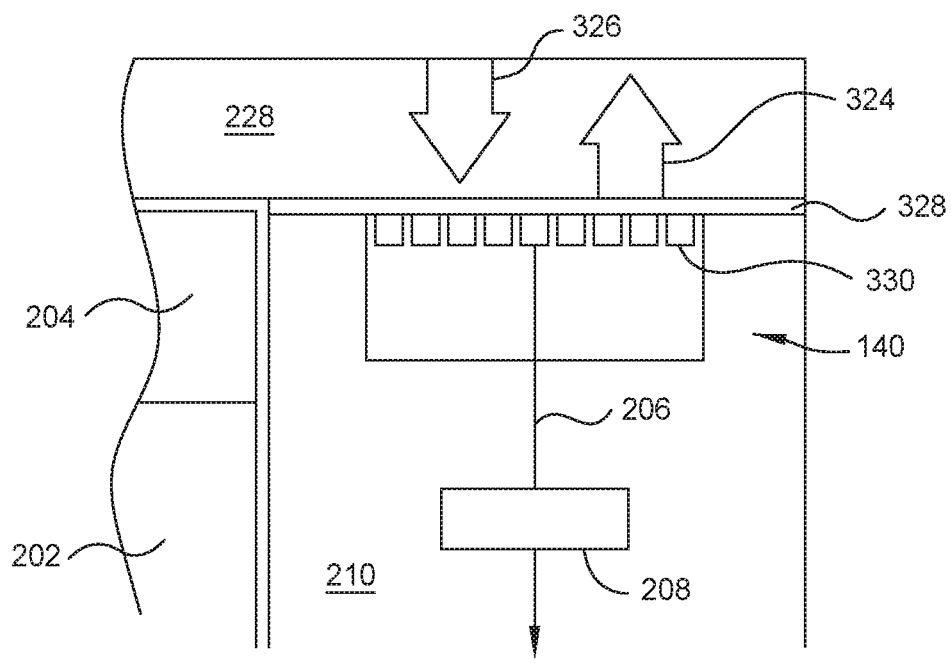
FIG. 3B is a plan view of a portion of the substrate support assembly of FIG. 1A having an alternate example of a ring sensor.

FIG. 3B is a plan view of a portion of the substrate support assembly of FIG. 1A having an alternate example of the ring sensor. The ring sensor 140 is illustrated as an acoustic sensor, which includes a transmitting element and a receiving element, i.e. a transmitting-receiving element 330, such as a transceiver. In one example, the transmitting element and a receiving element are two separate elements. In another example, the transmitting element and a receiving element a two distinctly separate elements. An acoustic sensor can directly measure the erosion of the edge ring 228. In some examples, the transmitting element and receiving element may be a single transmitting receiving element. A buffer layer 328 is disposed between sensor 140 and the edge ring 228. The buffer layer 328 effectively couples the acoustic wave from ring sensor 140 to edge ring 228, and vice versa. The transmitting-receiving element 330 abuts the buffer layer 328. An emitted acoustic wave 324 originates from the transmitting-receiving element 330 at a first time, and a reflected acoustic wave 326 is received at the transmitting-receiving element 330 at a second time that is later than the first time.

The acoustic wave ring sensor 140 can use piezoelectric material to generate and detect acoustic waves. If the wave propagates on the surface of the substrate, it is known as a surface wave; and if the wave propagating through the substrate it is called a bulk wave. Piezoelectric materials provide the transduction between electrical and mechanical response, and conversion of electrical signals into mechanical acoustic waves, and vice versa. In this example, an acoustic wave is excited and propagates through or on the surface of the edge ring 228. Changes to the characteristics of the wave propagation path affect the velocity and/or amplitude of the acoustic wave. Changes in velocity/amplitude can be monitored by measuring the natural frequency or phase characteristics of the ring sensor 140, which can then be correlated to the corresponding physical quantity being measured. In this example, the physical quantity measured is difference between the original thickness of the edge ring 228 and the current thickness of the edge ring 228. The change in thickness of the edge ring 228 corresponds to the erosion of the edge ring 228.

The ring sensor 140 is configured to measure erosion in the edge ring 228. The erosion of the edge ring 228 can also be determined by measuring the time of flight $t_{of}$ of the acoustic wave as it propagates through the edge ring 228. Herein, the acoustic wave includes the emitted acoustic wave 324 and the reflected acoustic wave 326. A time of flight is expressed by the equation $$t_{of} = \frac{2d}{v}.$$

The variable t represents the time of flight, v represents the velocity of the acoustic waves traveling through the edge ring 228, and d represents the distance traveled by emitted acoustic wave 324 or the reflected acoustic wave 326. The distance d corresponds to the thickness of the edge ring 228. In addition to time of flight, the thickness of the edge ring 228 may also be determined by calculating sound wave attenuation. Attenuation of sounds waves through a medium is expressed as $A=A_o e^{-\alpha x}$, where x is the thickness of the edge ring 228, A is amplitude change of a decaying sound wave $A_o$, and $\alpha$ is an attenuation factor based upon the material of the edge ring 228.

Surface acoustic waves consist of the superposition of a longitudinal and a vertical shear component. The waves are bound to the surface, and decay exponentially with the distance from the surface. The common structure of a surface acoustic wave (SAW) device consists of piezoelectric material with interdigital transducers (IDTs) patterned on top. An acoustic wave is excited and travels along the surface when an AC voltage is applied on the input IDT by piezoelectric effect. The operation frequency ($f_{res}$) of the SAW device ranges from the 10 kHz to 1 GHz range. The operation frequency ($f_{res}$) of the piezoelectric material can be expressed by the equation: $f_{res}=V_R/\lambda$, where $V_R$ is Rayleigh wave velocity determined by material properties and $\lambda$ is the wavelength defined as the periodicity of the IDT. A bulk acoustic wave travels through a piezoelectric material, and is faster than a surface acoustic wave, because it contain either longitudinal or shear waves. In a bulk acoustic wave, the change in frequency is inversely proportional to the active area A and the square root of the density of piezoelectric material and shear modulus of the piezoelectric material. The metric may be acquired by analyzing the time of flight of the acoustic wave through the edge ring 228. The metric may also be acquired by analyzing the attenuation of the signal as the wave propagates through the medium.

Impedance Ring Sensors

Figure 3C:
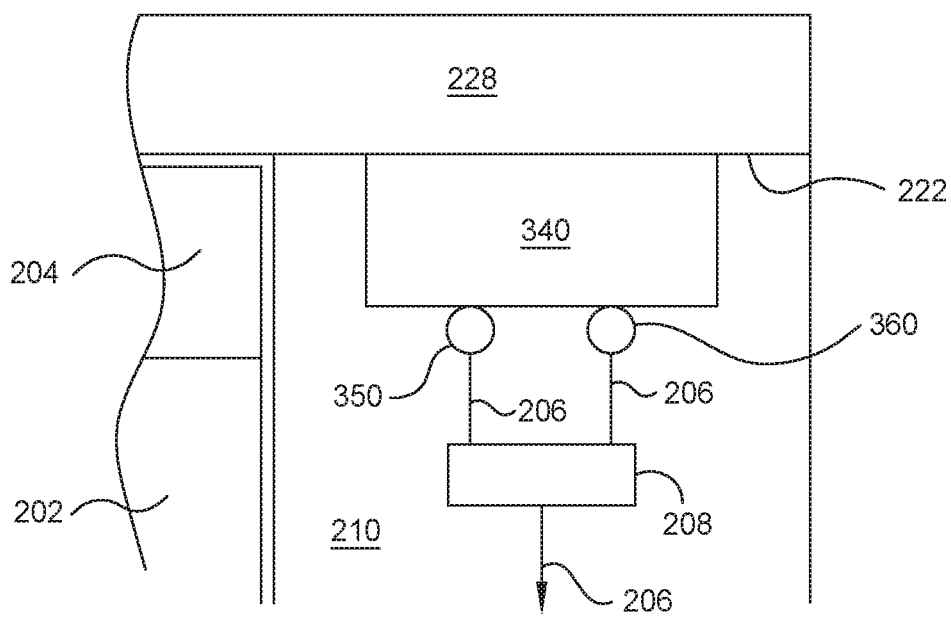
FIG. 3C is a plan view of a portion of the substrate support assembly of FIG. 1A having an alternate example of a ring sensor.
Figure 3D:
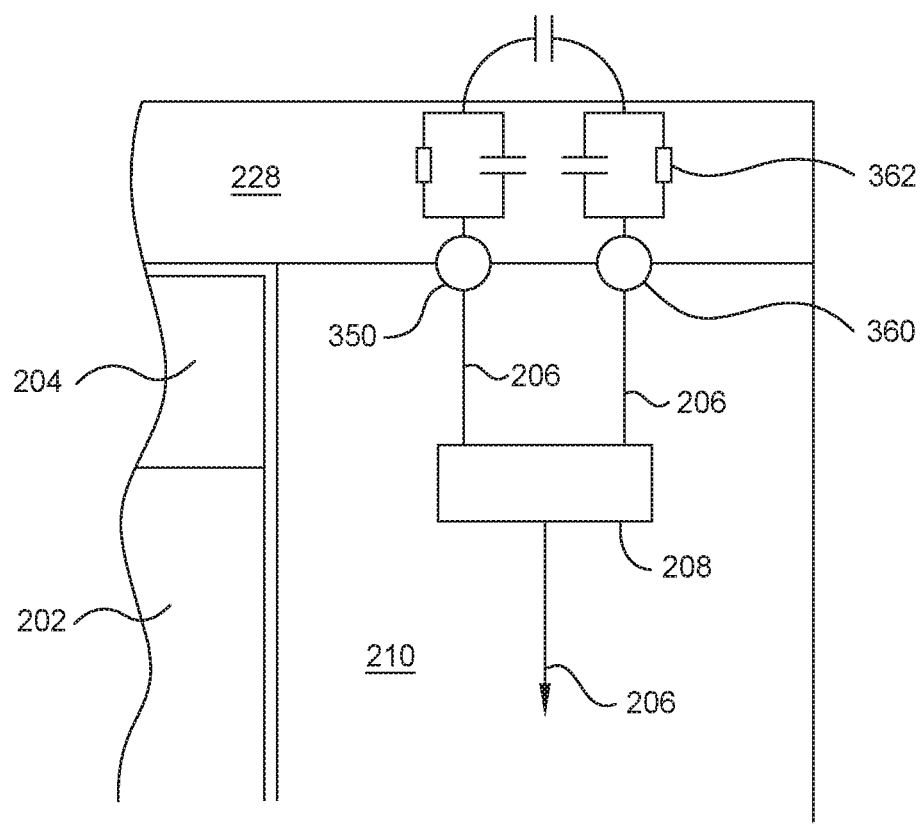
FIG. 3D is a plan view of a portion of the substrate support assembly of FIG. 1A having an alternate example of a ring sensor.

Turning now to FIGS. 3C and 3D, FIGS. 3C and 3D are plan views of a portion of the substrate support assembly of FIG. 1A having an alternate examples of the ring sensor 140. The ring sensor 140 may be embodied as an impedance ring sensor. An impedance ring sensor can directly measure the erosion of the edge ring 228. Impedance (Z) is generally defined as the total opposition a device or circuit offers to the flow of an alternating current (AC) at a given frequency, and is represented as a complex quantity that may be expressed as a vector. An impedance vector consists of a real part (resistance, R) and an imaginary part (reactance, X).

In at least one example, the first electrode 350 and the second electrode 360 are coupled to the communication circuit 208 via wiring 206. As current is passed through the edge ring 228 via the first and second electrodes 350 and 360, the ring sensor 140 determines a metric of the edge ring 228 by utilizing an equivalent circuit model 362 that includes the edge ring 228 and the first and second electrodes 350 and 360, and ambient. A signal source section generates an AC signal. In one example, the AC signal is an RF signal. The RF signal is applied to the edge ring 228 at a given frequency, which may be between 10 Hz and 10 GHz. In another example, the frequency may be between 10 kilohertz and 1 gigahertz. The RF current-voltage method is based on the linear relationship of the voltage-current ratio to impedance, as expressed by Ohm's law. The extracted impedances, resistive impedance and capacitive impedance, of the overall circuit is directly proportional to the thickness of edge ring 228. In this manner, the direct monitoring of the erosion of edge ring 228 can be accomplished. For example, a few ohms, 10 s ohms, or 100 s ohms of impedance change can correspond to about 1 or more microns of edge ring 228 erosion. With the disclosure herein, high-resolution monitoring of edge ring 228 erosion can be realized to within less than 1 micron. As in each of the other examples, the communication circuit 208 communicates with the CPU 620.

In a related example, electro-mechanical (EM) impedance may be determined with a piezoelectric sensor. A piezoelectric transducer 340 is bonded to the bottom surface 207 of the edge ring 228. When excited by an alternating electric voltage, the piezo-electric transducer 340 applies a local strain parallel to the lower surface 222 of the edge ring 228, transmitting elastic waves into the edge ring 228.

The ring sensor arrangement may be modelled as a spring-mass-damper system, where m represents the mass of the edge ring 228, and the spring constant k corresponds to the resistance of the edge ring 228, and the damping coefficient c corresponds to a material property of the edge ring 228. Generally, a piezoelectric transducer has very high DC output impedance and can be modeled as a proportional voltage source. A voltage V at the source is directly proportional to the applied force, pressure, or strain. The output voltage signal is then related to this mechanical force as if it had passed through the equivalent circuit represented by the spring-mass-damper model. The erosion of edge ring 228 can result in the change of acoustic wave characteristics in the edge ring 228. The change in acoustic wave characteristics can affect the equivalent mass m, spring constant, k, and damping coefficient, C. Accordingly, the impedance output characteristics of EM impedance changes as the erosion of edge ring 128 continues. The EM impedance spectrum, including the natural frequency shift, can be monitored to determine the erosion of edge ring 228.

Figure 4:
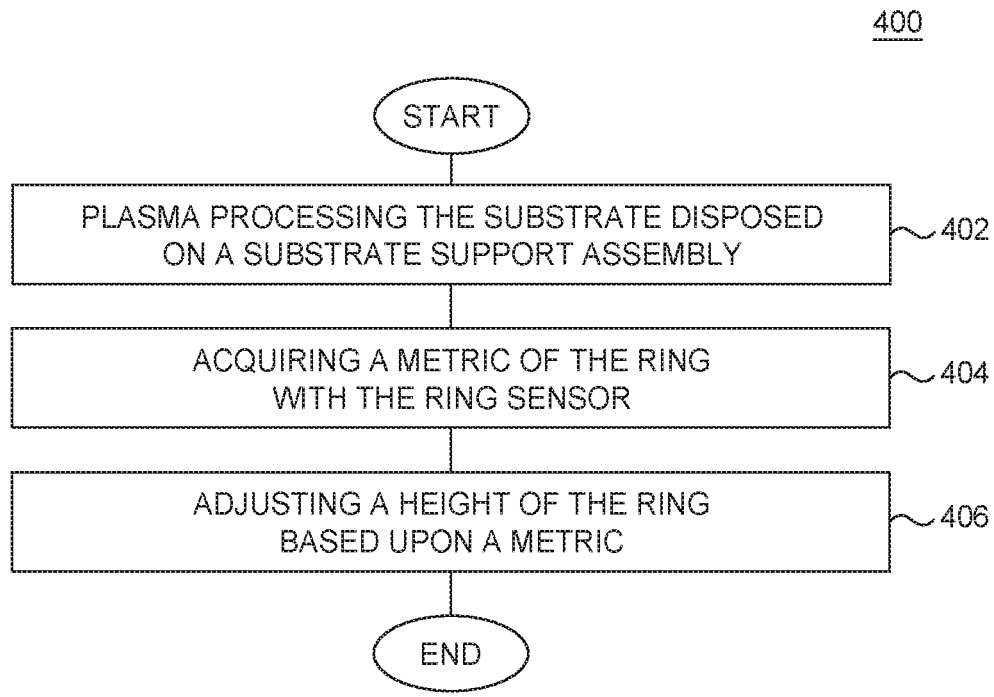
FIG. 4 is an exemplary method for processing the substrate in the processing chamber of FIG. 1.

The various sensors examples disclosed herein can be utilized in a method 400 of processing a substrate, as depicted in FIG. 4. FIG. 4 is an exemplary method for processing the substrate in the processing chamber of FIG. 1. The method 400 begins at block 402 where the substrate W is processed in the plasma processing chamber. At block 404, a metric of the edge ring 228 is acquired utilizing a ring sensor 140 disposed below the top surface 131 of the substrate support assembly 120. The metric corresponding to a displacement, impedance, or an acoustic wave of the edge ring 228. In one example, ring sensor 140 is disposed within the chamber body 102 below the top surface 131 of the substrate support assembly 120. The ring sensor 140 may also be positioned outward of the outer periphery 132 of the substrate support assembly 120. In another example, the ring sensor 140 is positioned inside the outer periphery 132 of the substrate support assembly 120, i.e., inside the substrate support assembly 120. At block 406, a height of the edge ring 228 is adjusted based upon the metric. At block 408, a second substrate is processed in the plasma processing chamber. The edge ring 228 height is adjusted to account for any erosion of the ring to ensure the uniformity of the plasma processing of the second substrate.

Referring now additionally to FIG. 6, FIG. 6 is a schematic view of a computer system suitable for implementing various examples of the plasma processing chamber and method and apparatus for determining a metric related to erosion of the ring assembly 128. The control of the conductive sleeve 520 may be controlled by a controller 618 that is coupled to a central processing unit (CPU) 620. The CPU 620 is operable with a memory 622 and a mass storage device, an input control unit, and a display unit (not shown), such as power supplies, clocks, cache, input/output (I/O) circuits, and the liner, coupled to the various components of the processing system to facilitate control of the substrate processing. As described above, the ring sensor 140 also communicates with the CPU 620 via wiring 206.

To facilitate control of the plasma processing chamber 100 described above, the CPU 620 may be one of any form of general purpose computer processor that can be used in an industrial setting, such as a programmable logic controller (PLC), for controlling various chambers and sub-processors. The memory 622 is coupled to the CPU 620 and the memory 622 is non-transitory and may be one or more of readily available memory such as random access memory (RAM), read only memory (ROM), floppy disk drive, hard disk, or any other form of digital storage, local or remote. The communication circuit 208 is coupled to the CPU 620 for supporting the processor in a conventional manner. Charged species generation, heating, and other processes are generally stored in the memory 622, often as software routine. Erosion monitoring information, including edge ring 228 thickness and changes in thickness of the edge ring 228 are also stored in memory 622. The memory 622 may also store each of the aforementioned variables related to erosion monitoring. The software routine may also be stored and/or executed by a second CPU (not shown) that is remotely located from the processing chamber 100 being controlled by the CPU 620.

The memory 622 is in the form of computer-readable storage media that contains instructions, that when executed by the CPU 620, facilitates the operation of the plasma processing chamber 100. The instructions in the memory 622 are in the form of a program product such as a program that implements the method of the present disclosure. The program code may conform to any one of a number of different programming languages. In one example, the disclosure may be implemented as a program product stored on a computer-readable storage media for use with a computer system. The program(s) of the program product define functions of the examples (including the methods described herein). Illustrative computer-readable storage media include, but are not limited to: (i) non-writable storage media (e.g., read-only memory devices within a computer such as CD-ROM disks readable by a CD-ROM drive, flash memory, ROM chips, or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are examples of the present disclosure.

While the foregoing is directed to specific examples, other and further examples may be devised without departing from the basic scope thereof, and the scope thereof is determined by the claims that follow.

What we claim is:
1. A plasma processing chamber comprising:
   a chamber body having a plurality of walls defining an internal volume;
   a substrate support assembly disposed within the internal volume, wherein the substrate support assembly comprises:
   an outer periphery; and
   a substrate support extending to the outer periphery and having a top surface;
   an edge ring having an upper surface and a lower surface opposite the upper surface, the lower surface of the edge ring disposed on the top surface of the substrate support proximate the outer periphery;
   a sleeve configured to at least partially support the edge ring, the sleeve cylindrical in shape and circumscribing the substrate support, the sleeve having an opening formed along an upper surface of the sleeve, wherein the edge ring further comprises an attachment member aligned with the opening in the sleeve; and
   a first sensor fixedly disposed within the opening of the sleeve adjacent to and below the upper surface of the sleeve, the sleeve disposed below the top surface and outside the outer periphery of the substrate support assembly, the first sensor configured to detect a metric of erosion of the edge ring, wherein the first sensor is a displacement sensor, and the displacement sensor includes a flexible membrane attached to sidewalls of the opening and arranged such that the attachment member contacts and displaces the flexible membrane.

2. The plasma processing chamber of claim 1, wherein the metric is indicative of erosion of the upper surface of the edge ring.

3. The plasma processing chamber of claim 2 further comprising:
   a plasma screen coupled to the outer periphery of the substrate support assembly, the plasma screen having an upper screen surface and a plurality of orifices extending therethrough.

4. The plasma processing chamber of claim 2, further comprising:
   a second sensor; and
   a third sensor, wherein the first sensor, second sensor, and third sensor are each configured to detect erosion in the edge ring.

5. The plasma processing chamber of claim 4, wherein the first sensor, second sensor, and third sensor are equidistantly spaced with respect to the edge ring.

6. The plasma processing chamber of claim 1, wherein the sleeve is configured to move the edge ring between a lowered and a raised position.

7. The plasma processing chamber of claim 1, wherein the opening formed into the upper surface of the sleeve has the first sensor and the first sensor is exposed to the edge ring.

* * * * *